(12) United States Patent
Shiozawa et al.

(10) Patent No.: US 11,594,424 B2
(45) Date of Patent: Feb. 28, 2023

(54) SUBSTRATE PROCESSING METHOD AND SUBSTRATE PROCESSING APPARATUS

(71) Applicant: TOKYO ELECTRON LIMITED, Tokyo (JP)

(72) Inventors: Takahiro Shiozawa, Koshi (JP); Masashi Enomoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/271,165

(22) PCT Filed: Aug. 23, 2019

(86) PCT No.: PCT/JP2019/033124
§ 371 (c)(1),
(2) Date: Feb. 24, 2021

(87) PCT Pub. No.: WO2020/045302
PCT Pub. Date: Mar. 5, 2020

(65) Prior Publication Data
US 2021/0249277 A1     Aug. 12, 2021

(30) Foreign Application Priority Data

Aug. 30, 2018 (JP) .............................. JP2018-161932

(51) Int. Cl.
*H01L 21/461* (2006.01)
*H01L 21/033* (2006.01)
*H01L 21/48* (2006.01)

(52) U.S. Cl.
CPC ........ *H01L 21/461* (2013.01); *H01L 21/0337* (2013.01); *H01L 21/4828* (2013.01)

(58) Field of Classification Search
CPC ...... H01L 21/461; H01L 21/0337; B05D 3/06
See application file for complete search history.

(56) References Cited

U.S. PATENT DOCUMENTS

2018/0164689 A1*  6/2018  Sano ................... H01L 21/6719
2018/0348639 A1*  12/2018  Liu ........................ G03F 7/325
(Continued)

FOREIGN PATENT DOCUMENTS

| CN | 108183068 A | 6/2018 |
|---|---|---|
| JP | 2001-272786 A | 10/2001 |
| JP | 2018-98229 A | 6/2018 |

OTHER PUBLICATIONS

Merriam-Webster definition of "vacuum" via https://www.merriam-webster.com/dictionary/vacuum ; pp. 1-8 (Year: 2022).*
(Continued)

*Primary Examiner* — Binh X Tran
(74) *Attorney, Agent, or Firm* — Nath, Goldberg & Meyer; Jerald L. Meyer; Tanya E. Harkins

(57) ABSTRACT

A substrate processing method is a method of processing a substrate on which a metal-containing liquid for a film below a resist is applied, wherein prior to a heating process of performing a heat treatment on the substrate applied with the metal-containing liquid, the substrate processing method includes: a deprotection promoting process of promoting deprotection of functional groups in a material for the film included in the substrate on which the metal-containing liquid has been applied; a solvent removing process of removing a solvent included in the metal-containing liquid on the substrate; and a moisture absorbing process of bringing a surface of the substrate into contact with moisture.

8 Claims, 11 Drawing Sheets

(56) References Cited

U.S. PATENT DOCUMENTS

2019/0018319 A1* 1/2019 Yamazaki ............. G03F 7/0392
2019/0146337 A1* 5/2019 Zl ........................... G03F 7/325
                                                                                              430/299

OTHER PUBLICATIONS

The Engineering Toolbox, "Parts per Million—ppm" via https://www.engineeringtoolbox.com/ppm-d_1039.html ; pp. 1-8 (Year: 2008).*

* cited by examiner

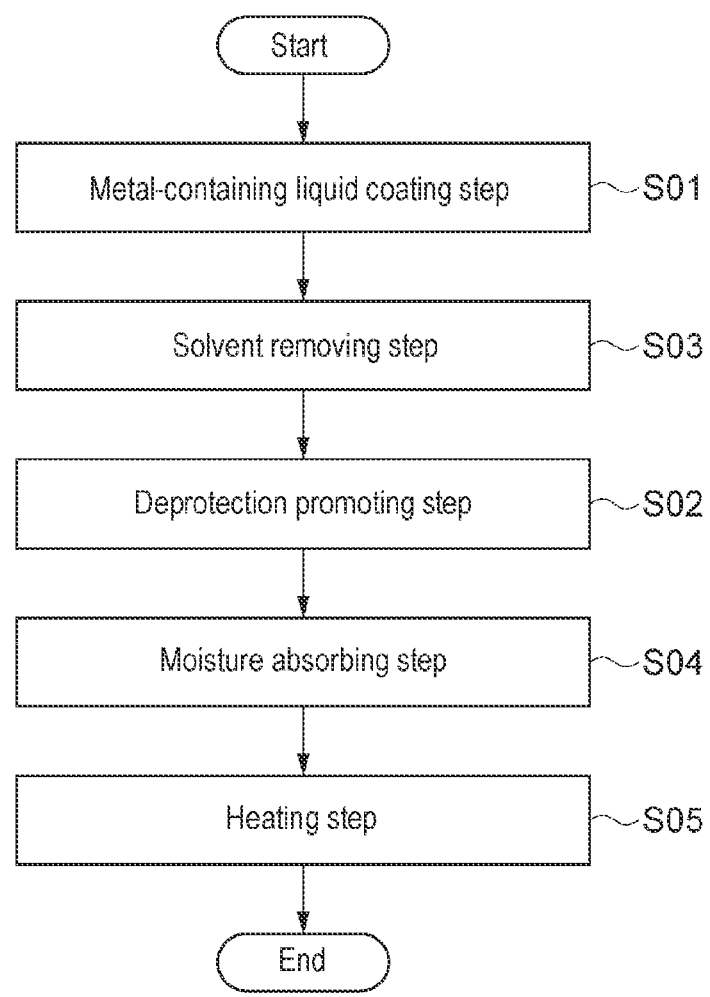

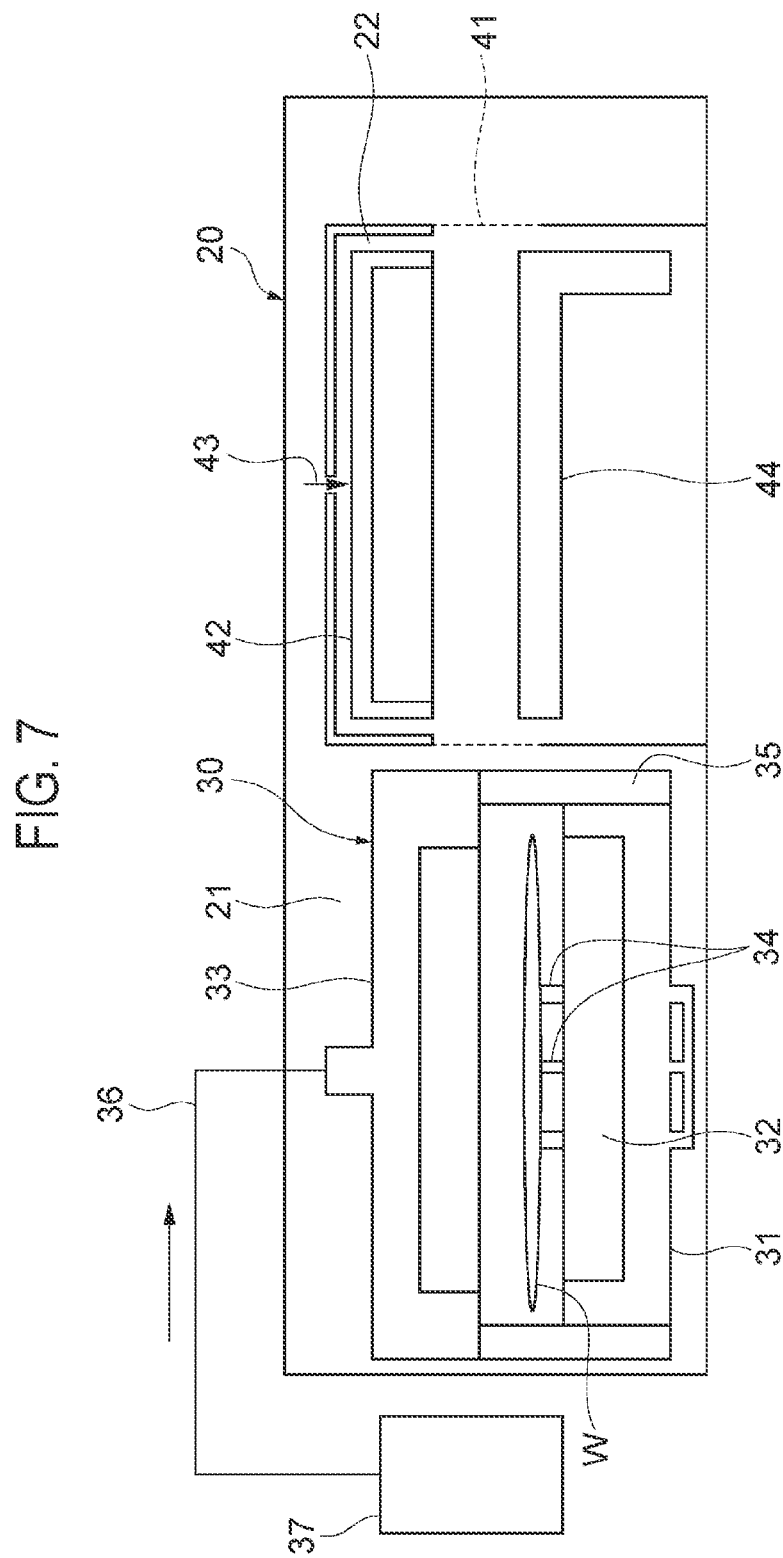

3σ=1.54nm

3σ=0.52nm

3σ=0.77nm

3σ=0.76nm

CDU=1.38nm

CDU=1.29nm

CDU=1.38nm

CDU=0.66nm

US 11,594,424 B2

SUBSTRATE PROCESSING METHOD AND SUBSTRATE PROCESSING APPARATUS

This is a National Phase Application filed under 35 U.S.C. 371 as a national stage of PCT/JP2019/033124, filed Aug. 23, 2019, an application claiming the benefit of Japanese Application No. 2018-161932, filed Aug. 30, 2018, the content of each of which is hereby incorporated by reference in its entirety.

TECHNICAL FIELD

Exemplary embodiments of the present disclosure relate to a substrate processing method and a substrate processing apparatus.

BACKGROUND

A process of manufacturing a semiconductor includes a step of forming a resist pattern for etching on a surface of a wafer (substrate). The resist pattern is formed by exposing and developing a resist film formed on the surface of the substrate.

Patent Document 1 discloses forming a mask material by applying a mask material solution containing a metal oxide directly below a resist film and heating the mask material solution, and then forming a resist pattern by forming a resist film on the mask material.

PRIOR ART DOCUMENT

Patent Document

Patent Document 1: Japanese laid-open publication No. 2001-272786

An exemplary embodiment of the present disclosure provides a substrate processing method and a substrate processing apparatus in which uniformity in line width of a resist pattern is improved.

SUMMARY

A substrate processing method according to an exemplary embodiment is a method of processing a substrate on which a metal-containing liquid for a film below a resist is applied, wherein prior to a heating process of performing a heat treatment on the substrate applied with the metal-containing liquid, the substrate processing method includes: a deprotection promoting process of promoting deprotection of functional groups in a material for the film included in the substrate on which the metal-containing liquid has been applied; a solvent removing process of removing a solvent included in the metal-containing liquid on the substrate; and a moisture absorbing process of bringing a surface of the substrate into contact with moisture.

According to an exemplary embodiment of the present disclosure, it is possible to provide a substrate processing method and a substrate processing apparatus in which the uniformity of line width of a resist pattern is improved.

BRIEF DESCRIPTION OF DRAWINGS

FIG. 6 is a flowchart for explaining a substrate processing method according to a modification.

FIG. 7 is a schematic view of a processing module of a substrate processing system according to a modification.

DETAILED DESCRIPTION

Figure 1:
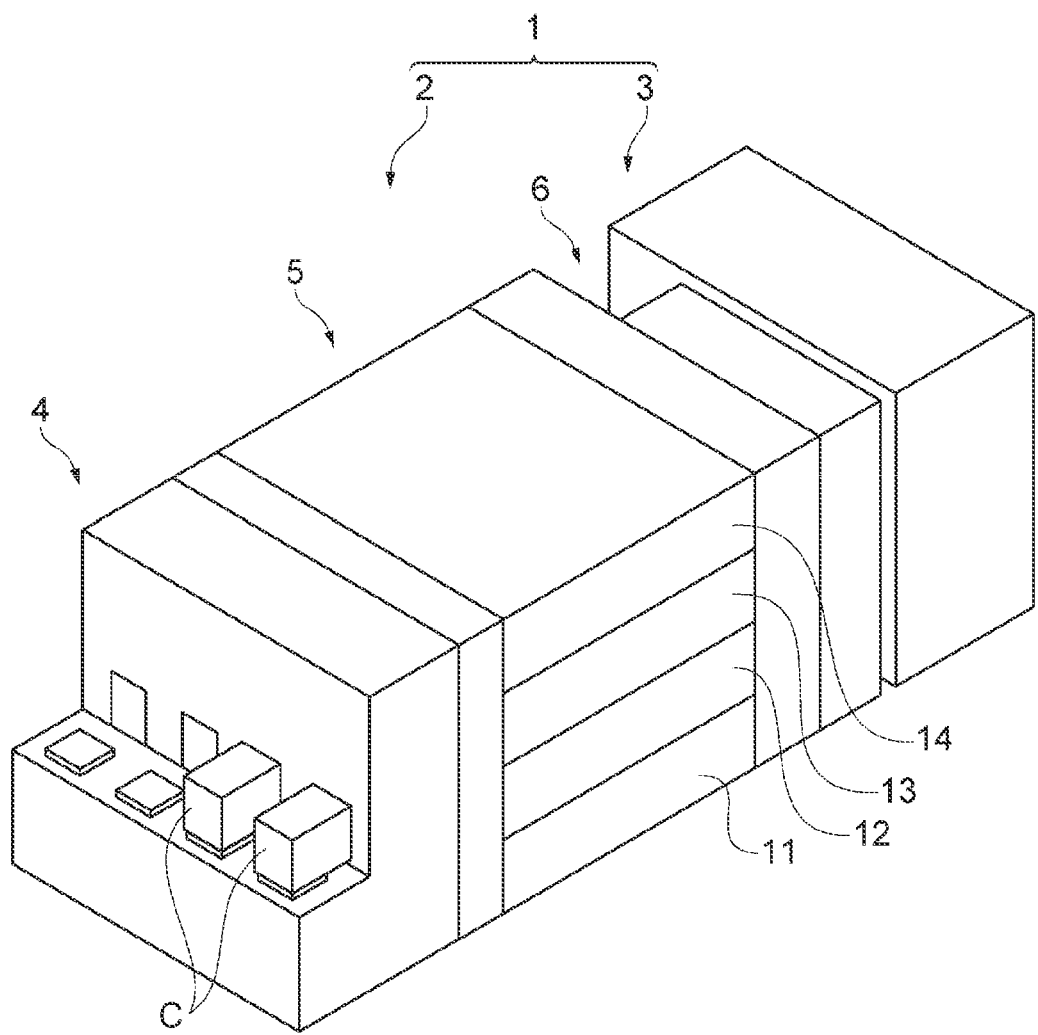
FIG. 1 is a perspective view illustrating a substrate processing system according to an exemplary embodiment.

Hereinafter, various exemplary embodiments will be described.

In an exemplary embodiment, a substrate processing method is a method of processing a substrate coated with a metal-containing liquid for a film below a resist. Prior to a heating step of performing a heat treatment on the substrate coated with the metal-containing liquid, the substrate processing method includes: a deprotection promoting step of promoting deprotection of functional groups in a material for the film included in the substrate to which the metal-containing liquid has been applied; a solvent removing step of removing a solvent included in the metal-containing liquid applied on the substrate; and a moisture absorbing step of bringing a surface of the substrate into contact with moisture.

In the substrate processing method, prior to the heating step performed on the substrate coated with the metal-containing liquid, the deprotection promoting step of promoting deprotection of the functional groups in the material for the film, the solvent removing step of removing the solvent included in the metal-containing liquid, and the moisture absorbing step of bringing the surface of the substrate into contact with the moisture are performed. By forming the film of the metal-containing liquid below the resist by performing the heating step after performing these steps, characteristics of the film are improved, and uniformity in line width of a resist pattern in a resist film provided above the film is improved.

In another exemplary embodiment, the deprotection promoting step is a step of irradiating the substrate with ultraviolet rays, and the solvent removing step is a step of drying the substrate.

By irradiating the substrate with ultraviolet rays as the deprotection promoting step and drying the substrate as the solvent removing step, the characteristics of the film formed of the metal-containing liquid are further improved, and the uniformity in line width of the resist pattern in the resist film is improved.

In another exemplary embodiment, the moisture absorbing step is performed after the solvent removing step.

By performing the moisture absorbing step after the solvent removing step, contact between film material contained in the metal-containing liquid, from which the solvent has been removed, and moisture is promoted. Therefore, since it is possible to promote a reaction using moisture in the material of the film, the effect of improving the uniformity in line width of the resist pattern in the resist film is enhanced.

In another exemplary embodiment, the moisture absorbing step is performed after the deprotection promoting step and the solvent removing step.

By performing the moisture absorbing step after the deprotection promoting step and the solvent removing step, it is possible to perform the heating step in a state in which moisture in the vicinity of the film material is prevented from drying and decreasing in the moisture absorbing step. Therefore, the effect of promoting the reaction using moisture in the material of the film is enhanced.

In another exemplary embodiment, the solvent removing step is performed after the deprotection promoting step.

Bo performing the solvent removing step after the deprotection promoting step, it is possible to shorten an elapsed time between the solvent removing step and the heating step. Therefore, even when heating temperatures required in the solvent removing step and the heating step change depending on a type of the metal-containing liquid including the solvent, it is possible to appropriately perform the solvent removing step and the heating step.

In another exemplary embodiment, the deprotection promoting step is performed after the solvent removing step.

By performing the deprotection promoting step after the solvent removing step, the deprotection promoting step is performed after removing solvent from the metal-containing liquid to some extent. Accordingly, since it is possible to perform the deprotection promoting step in a state in which a ratio of the solvent in the metal-containing liquid coated on the substrate is reduced, it is possible to prevent the solvent from adhering to an apparatus that performs the deprotection promoting step. Thus, it is possible to suppress a frequency of maintenance.

In another exemplary embodiment, the deprotection promoting step is performed in a low-oxygen atmosphere.

By performing the deprotection promoting step in the low-oxygen atmosphere, it is possible to prevent oxygen contained in the atmosphere from affecting deprotecting the functional groups during the deprotection promoting step.

In an exemplary embodiment, a substrate processing apparatus includes: a liquid processor configured to apply a metal-containing liquid for a film below a resist to a substrate, a deprotection promotor configured to promote deprotecting functional groups in a material for the film included in the substrate to which the metal-containing liquid has been applied; a solvent remover configured to remove a solvent included in the metal-containing liquid on the substrate; a moisture absorbing processor configured to bring moisture into contact with a surface of the substrate coated with the metal-containing liquid, and a heating processor configured to perform a heating treatment on the substrate after processed by the deprotection promotor, the solvent remover; and the moisture absorbing processor.

According to the above-mentioned substrate processing apparatus, prior to the heating treatment by the heating processor, the deprotection promotor promotes deprotecting the functional groups in the material for the film, the solvent remover removes the solvent included in the metal-containing liquid, and the moisture absorbing processor brings the surface of the substrate with moisture. By forming the film using the metal-containing liquid below the resist through the procedure described above, characteristics of the film are improved, and uniformity in line width of a resist pattern in a resist film provided above the film is improved.

In another exemplary embodiment, the deprotection promotor, the solvent remover, the moisture absorbing processor, and the heat processor are configured by the same processing module. Within the same processing module, the solvent remover, the moisture absorbing processor, and the heating processor are provided in the same processing chamber, and the same heating mechanism is used for the solvent remover and the heating processor.

By configuring the deprotection promotor, the solvent remover, the moisture absorbing processor, and the heating processor by the same processing module; it is possible to perform processes related to forming the film using the metal-containing by the same processing module. Therefore, it is possible to reduce movement of the substrate in the apparatus. In addition, since the solvent remover, the moisture absorbing processor, and the heating processor are provided in the same processing chamber, it is possible to prevent a solvent atmosphere, moisture, or the like, which is generated during operations performed by the respective parts described above, from scattering to other components or the like in another processing chamber. Furthermore, by using the same heating mechanism as the solvent remover and the heating processor, it is possible to perform a series of processes using a simpler apparatus.

Hereinafter, various exemplary embodiments will be described in detail with reference to the drawings. In the description, the same elements or elements having the same function will be denoted by the same reference numerals, and a redundant description will be omitted.

[Substrate Processing System]

A substrate processing system 1 is a system for performing, on a substrate, formation of a photosensitive film, exposure of the photosensitive film, and development of the photosensitive film. The substrate to be processed is, for example, a semiconductor wafer W. The photosensitive film is, for example, a resist film. The substrate processing system 1 includes a coating and developing apparatus 2 and an exposure apparatus 3. The exposure apparatus 3 performs an exposure process of the resist film (photosensitive film) formed on the wafer (substrate) W, Specifically, a portion to be exposed on the resist film is irradiated with energy beams through a method such as liquid immersion exposure. The coating and developing apparatus 2 performs a process of forming the resist film on a surface of the wafer (substrate) W before the exposure process performed by the exposure apparatus 3, and performs a process of developing the resist film after the exposure process.

[Substrate Processing Apparatus]

Figure 2:
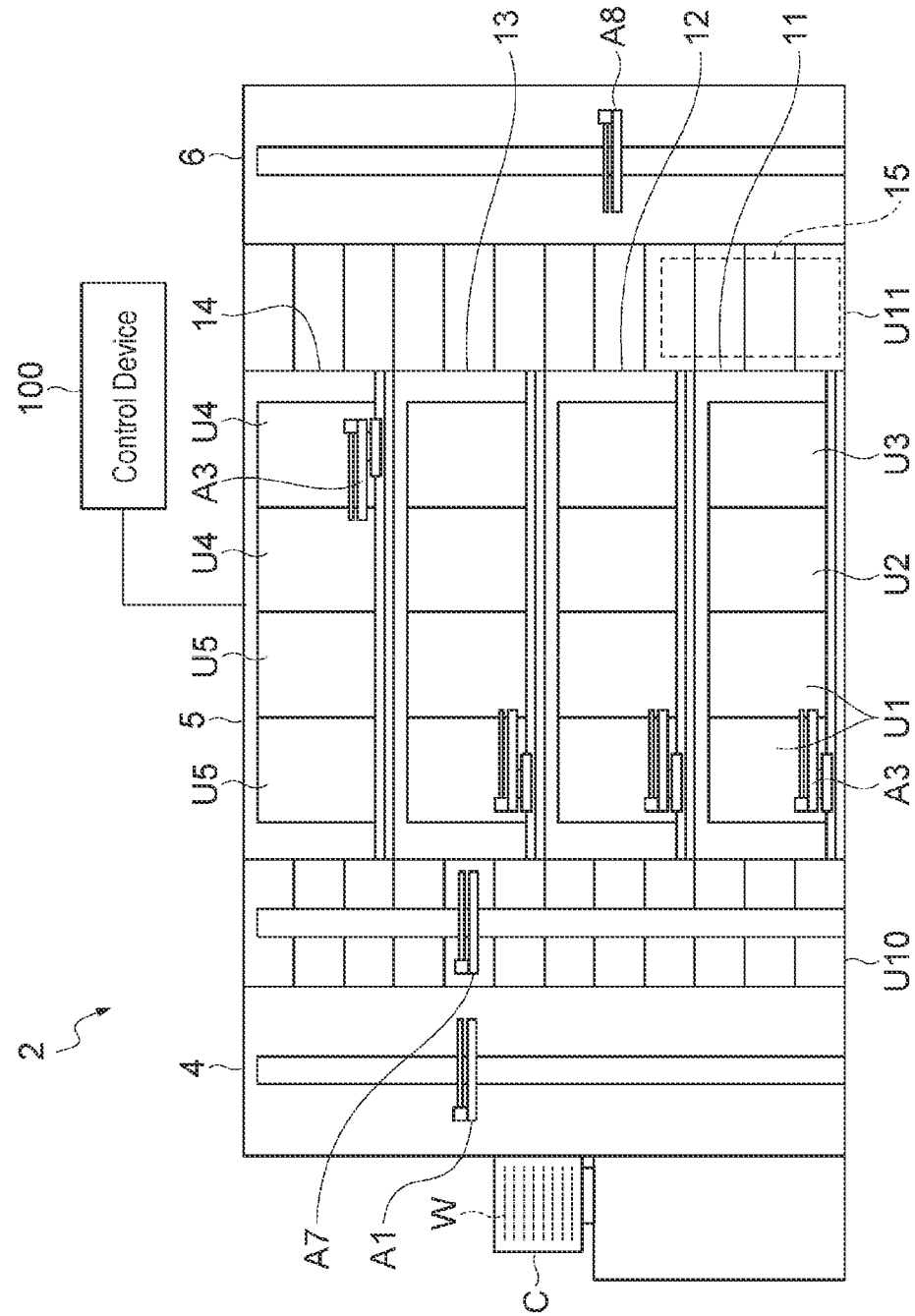
FIG. 2 is a schematic view illustrating an internal configuration of the substrate processing system according to an exemplary embodiment.

Hereinafter, a configuration of the coating and developing apparatus 2 will be described as an example of a substrate processing apparatus. As illustrated in FIGS. 1 and 2, the coating and developing apparatus 2 includes a carrier block 4, a processing block 5, an interface block 6, and a control device 100.

The carrier block 4 loads the wafer W into the coating and developing apparatus 2 and unloads the wafer W from the inside of the coating and developing apparatus 2. For example, the carrier block 4 is capable of supporting a plurality of carriers C for the wafer W, and has a delivery arm A1 therein. Each carrier C accommodates, for example, a plurality of circular wafers W. The delivery arm A1 takes the wafers W out of the carriers C, and delivers the wafers W to the processing block 5. In addition, the delivery arm A receives wafers \V from the processing block 5, and returns the wafers W into the carriers C.

The processing block 5 has a plurality of processing modules 11, 12, 13, and 14. The processing module 11 includes therein a liquid processing unit U1, a heat treatment unit U2, a light emission unit U3, and a transfer arm A3 configured to transfer the wafers W to the units described above. Each of the processing modules 12 and 13 also includes therein a liquid processing unit U1, a heat treatment unit U2, and a transfer arm A3 configured to transfer the wafers W to the units described above.

The processing module 11 forms an underlayer film on the surface of the wafer W and an intermediate film on the underlayer film by using the liquid processing unit U1, the heat treatment unit U2, and the light emission unit U3. The liquid processing unit U1 of the processing module 11 applies a processing liquid for forming the underlayer film and the intermediate film on the wafer W. The heat treatment unit U2 of the processing module 11 performs various kinds of heat treatment associated with the formation of the underlayer film and the intermediate film. The light emission unit U3 of the processing module 11 irradiates the wafer W with light (ultraviolet rays) when the underlayer film is formed on the wafer W. Details of the processing performed by the processing module 11 will be described later. An example of the underlayer film may include an antireflection (SiARC) film. In addition, an example of the intermediate film may include a spin-on-carbon (SOC) film or a hard mask containing metal (a metal hard mask). In the present embodiment, a case where the above-mentioned metal hard mask is formed as the intermediate film provided directly under the resist film will be described. The underlayer film may be omitted. As the metal hard mask, an alloy film in which a plurality of metallic materials are combined may be used in addition to a TiN film. The material of the metal hard mask described in the present embodiment is not particularly limited.

A process of forming the metal hard mask will be briefly described below. A metal-containing liquid in which the metallic material constituting the metal hard mask is mixed in a solvent is applied on the wafer W, and a heat treatment is performed on the applied metal-containing liquid so as to cure the material of the metal hard mask. As a result, a film is formed. In the present embodiment, details of which will be described later, characteristics of the metal hard mask are improved by performing a deprotection promoting step, a solvent removing step, and a moisture absorbing step in the process of forming the metal hard mask.

The liquid processing unit U1 in the processing module 11 has a function as a liquid processor in the substrate processing apparatus (coating and developing apparatus 2) according to the present embodiment. The heat treatment unit U2 has a function as a solvent remover in the coating and developing apparatus 2. The light emission unit U3 has a function as a deprotection promotor in the coating and developing apparatus 2.

The processing module 12 forms the resist film on the intermediate layer film by using the liquid processing unit U1 and the heat treatment unit U2. The liquid processing unit U1 of the processing module 12 applies a processing liquid for forming the resist film on the intermediate layer film. The heat treatment unit U2 of the processing module 12 performs various kinds of heat treatment associated with the formation of the resist film. A specific example of the heat treatment may include a pre-applied bake (PAB) for curing the applied film to form a resist film R.

The processing module 13 forms an upperlayer film on the resist film by using the liquid processing unit U1 and the heat treatment unit U2. The liquid processing unit U1 of the processing module 13 applies a liquid for forming the upperlayer film on the resist film. The heat treatment unit U2 of the processing module 13 performs various kinds of heat treatment associated with the formation of the upperlayer film.

The processing module 14 includes therein a development unit U4, a heat treatment unit U5, and a transfer arm A3 configured to transfer the wafer W to the units described above. The processing module 14 performs a development process on the resist film after an exposure process by using the development unit U4 and the heat treatment unit U5. The development unit U4 performs the development process on the resist film by applying a developer on an exposed surface of the wafer W and then rinsing the developer by using a rinsing liquid. The heat treatment unit U5 performs various kinds of heat treatment associated with the development process. Specific examples of the heat treatment may include a heat treatment before the development process (post exposure bake (PEB)) and a heat treatment after the development process (post bake (PB)). The liquid processing unit U4 in the processing module 14 has a function as a moisture absorbing processor in the coating and developing apparatus 2 as the substrate processing apparatus according to the present embodiment.

In addition, the function as the moisture absorbing processor may be performed by a module or unit other than the development unit U4 in the processing module 14. Examples of the module having the function as the moisture absorbing processor may include a substrate cleaning module 15 illustrated in FIG. 2. The substrate cleaning module 15 is a module that performs a cleaning process using, for example, pure water so that droplets remaining on the substrate after a liquid immersion exposure process are removed (post immersion rinse (PER)), or so that uneven heating in the heat treatment before the development process is reduced. Other modules or units that perform a process using pure water, like the substrate cleaning module 15 described above, may be used as the moisture absorbing processor.

A shelf unit U10 is provided on the side of the carrier block 4 in the processing block 5. The shelf unit U10 is partitioned into a plurality of cells arranged in a vertical direction, A lift arm A7 is provided in the vicinity of the shelf unit U10. The lift arm A7 moves the wafer W up and down between the cells of the shelf unit U 10.

A shelf unit U11 is provided on the side of the interface block 6 in the processing block 5. The shelf unit U11 is partitioned into a plurality of cells arranged in the vertical direction. The substrate cleaning module 15 described above is provided in the vicinity of the shelf unit U11.

The interface block 6 delivers the wafer W to and from the exposure apparatus 3. For example, the interface block 6 includes therein a delivery arm A8, and is connected to the exposure apparatus 3. The delivery arm A8 delivers the wafer W placed on the shelf unit U11 to the exposure apparatus 3, and receives a water W from the exposure apparatus 3 to return the wafer W to the shelf unit U11.

The control device 100 controls the coating and developing apparatus 2 to execute a coating development process, for example, in the following sequence. First, the control device 100 controls the delivery arm A1 to deliver the wafer W in the carrier C to the shelf unit U10, and controls the lift arm A7 to place the wafer W in a cell for the processing module 11.

Subsequently, the control device 100 controls the transfer arm A3 to transfer the wafer W in the shelf unit U10 to the liquid processing unit U1, the heat treatment unit U2, and the light emission unit U3 in the processing module 11. Further, the control device 100 controls the liquid processing unit U1, the heat treatment unit U2, and the light emission unit U3 so as to form the underlayer film on the surface of the wafer W, and so as to form the intermediate film on the underlayer film. Thereafter, the control device 100 controls the transfer arm A3 to return the wafer W on which the underlayer film and the intermediate film are formed to the shelf unit U10, and controls the lift arm A7 to dispose the wafer W in a cell for the processing module 12. When necessary, the control device 100 may move the wafer W to the processing module 14 so as to perform a process required for forming the metal hard mask as an intermediate film.

Subsequently, the control device 100 controls the transfer arm A3 to transfer the wafer W in the shelf unit U10 to the liquid processing unit U1 and the heat treatment unit U2 in the processing module 12. Further, the control device 100 controls the liquid processing unit U1 and the heat treatment unit U2 so as to form the resist film on the surface of the wafer W. Thereafter, the control device 100 controls the transfer arm A3 to return the wafer W to the shelf unit U10, and controls the lift arm A7 to dispose the wafer W in a cell for the processing module 13.

Subsequently, the control device 100 controls the transfer arm A3 to transfer the wafer W in the shelf unit U10 to each unit in the processing module 13. In addition, the control device 100 controls the liquid processing unit U1 and the heat treatment unit U2 so as to form the upperlayer film on the resist film of the wafer W. Thereafter, the control device 100 controls the transfer arm A3 to transfer the wafer W to the shelf unit U1f.

Subsequently, the control device 100 controls the delivery arm device A8 to send the wafer W in the shelf unit U11 to the exposure apparatus 3. Thereafter, the control device 100 receives an exposed wafer W from the exposure apparatus 3 and controls the delivery arm A8 to dispose the water W in a cell for the processing module 14 in the shelf unit U11.

Subsequently, the control device 100 controls the transfer arm A3 to transfer the wafer W in the shelf unit U11 to each unit in the processing module 14, and controls the development unit U4 and the heat treatment unit U5 to perform the development process on the resist film of the wafer W. Thereafter, the control device 100 controls the transfer arm A3 to return the wafer W to the shelf unit U10, and controls the lift arm A7 and the transfer arm A1 to return the wafer W to the carrier C. Thus, the coating and developing process is completed.

The specific configuration of the substrate processing apparatus is not limited to the configuration of the coating and developing apparatus 2 described above by way of example. The substrate processing apparatus may be any apparatus, as long as it includes the heat treatment unit U2 or the heat treatment unit U5 and the control device 100 configured to control the same.

[Control Device]

Figure 3:
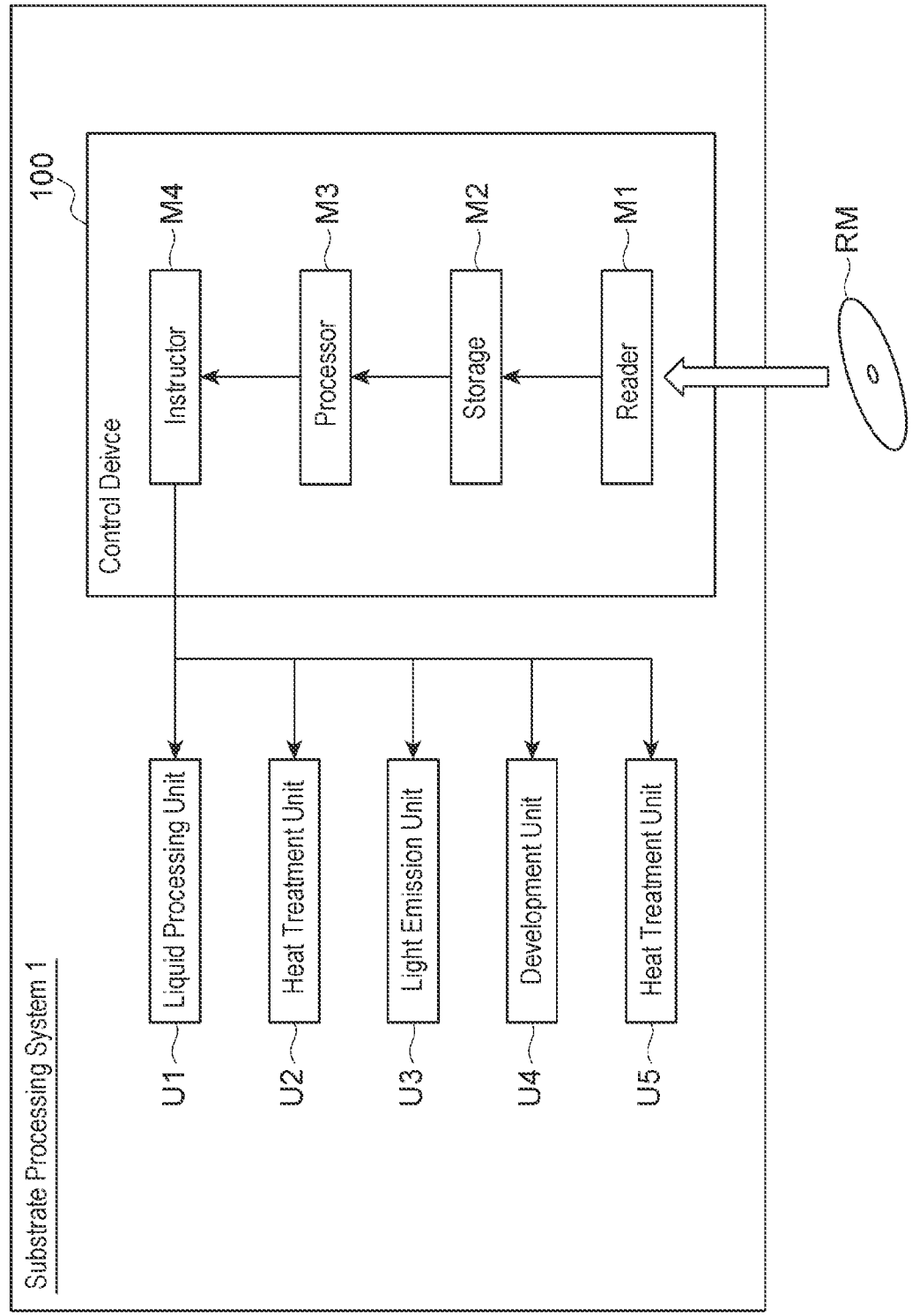
FIG. 3 is a block diagram illustrating a main part of the substrate processing system.

As illustrated in FIG. 3, the control device 100 includes a reader M1, a storage M2, a processor M3, and an instructor M4 as functional modules. These functional modules merely correspond to a plurality of modules into which the functions of the control device 100 is divided for convenience, which means that a hardware constituting the control device 100 is not necessarily divided into such modules. Each functional module is not limited to be implemented by executing a program, but may be implemented by a dedicated electric circuit (e.g., a logical circuit) or an integrated circuit (application specific integrated circuit (ASIC)) in which the electric circuit is integrated.

The reader M1 reads a program from a computer-readable recording medium RM. The recording medium RM stores a program for operating the respective parts of the substrate processing system 1. The recording medium RM may be, for example, a semiconductor memory, an optical recording disk, a magnetic recording disk, or a magneto-optical recording disk.

The storage M2 stores various data. The storage M2 stores, for example, the program read from the recording medium RM by the reader M1, various data used when processing the wafer W (so-called a processing recipe), and setting data input via an external input device (not illustrated) by an operator.

The processor M3 processes various data. The processor M3 generates operation signals for operating, for example, the liquid processing unit U1, the heat treatment unit U2, the light emission unit U3, the development unit U4, and the heat treatment unit U5 based on the various data stored in the storage M2.

The instructor M4 transmits the operation signals generated by the processor M3 to the respective apparatuses.

Figure 4:
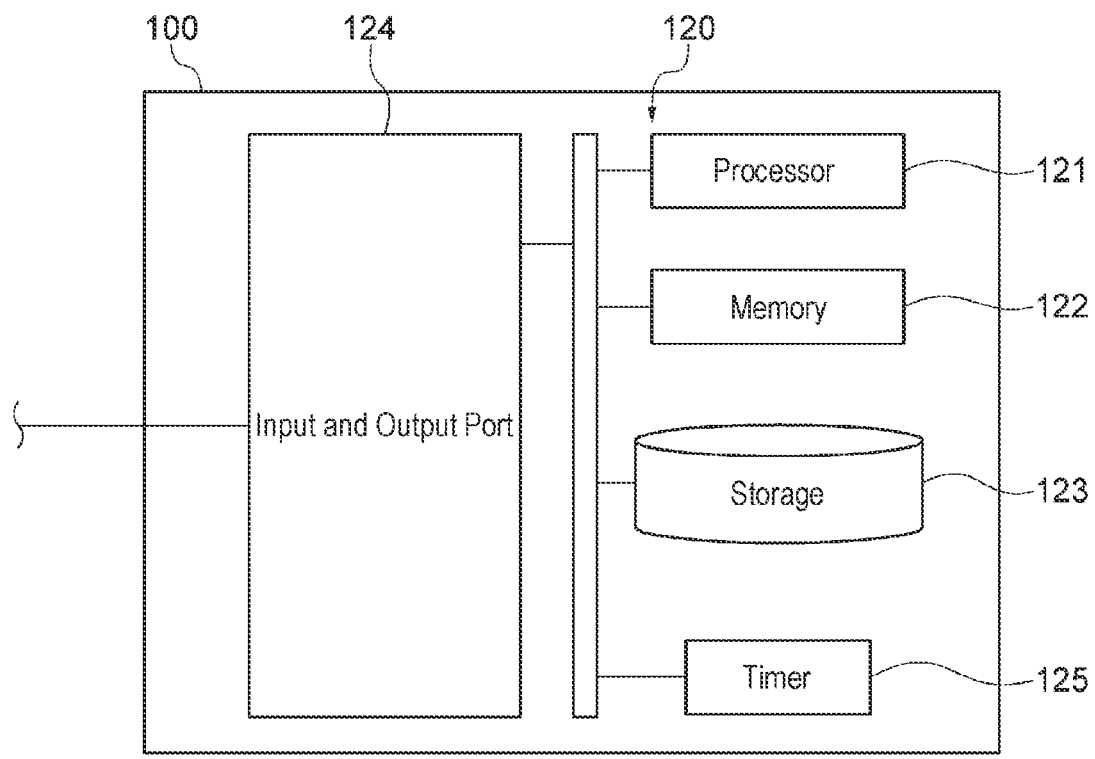
FIG. 4 is a schematic view illustrating a hardware configuration of a control device.

The hardware of the control device 100 is configured with one or more control computers. For example, the control device 100 includes a circuit 120 illustrated in FIG. 4. The circuit 120 includes one or more processors 121, a memory 122, a storage 123, an input and output port 124, and a timer 125, The storage 123 has a computer-readable storage medium such as a hard disc. The storage medium stores a program for causing the coating and developing apparatus 2 to execute a substrate processing procedure to be described later. The storage medium may be a nonvolatile semiconductor memory, or a removable memory such as a magnetic disk or an optical disk. The memory 122 temporarily stores the program loaded from the storage medium of the storage 123 and operation results performed by the processor 121. The processor 121 constitutes each of the above-described functional modules by executing the program in cooperation with the memory 122. The input and output port 124 performs inputs and outputs of electric signals between the respective parts of the substrate processing system 1 in response to a command from the processor 121. The tinier 125 measures an elapsed time by counting, for example, reference pulses of a predetermined cycle.

With the above-described configuration, the control device 100 controls the liquid processing unit U1, the heat treatment unit U2, the light emission unit U3, the development unit U4, the heat treatment unit U5, and the like included in the substrate processing system 1. At the same time, the control device 100 also controls other units (not illustrated in FIG. 3). The configuration of the control device 100 described above is an example, and the control device 100 is not limited to that described above.

[Substrate Processing Method]

Figure 5:
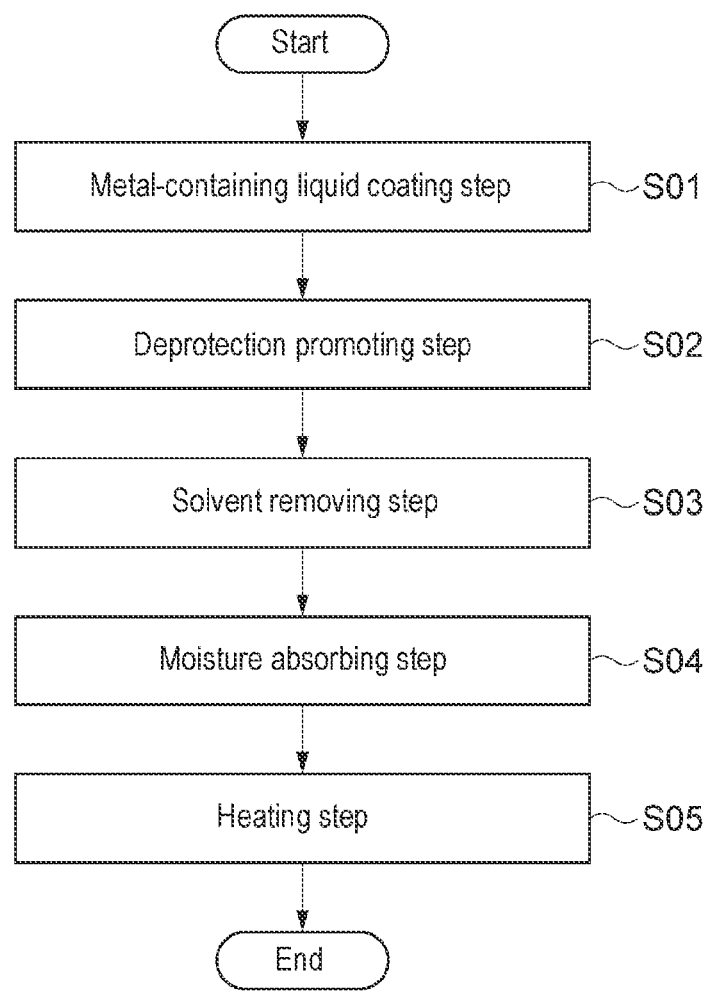
FIG. 5 is a flowchart for explaining a substrate processing method according to an exemplary embodiment.

Next, as an exemplary substrate processing method, a procedure in which the metal hard mask as the intermediate film disposed directly below the resist film is formed by using the coating and developing apparatus 2 will be described. As illustrated in FIG. 5, the procedure for forming the metal hard mask includes a metal-containing liquid coating step (S01), a deprotection promoting step (S02), a solvent removing step (S03), a moisture absorbing step (S04), and a heating step (S05). Each step is performed by controlling, by the control device 100, each unit constituting the coating and developing apparatus 2.

The metal-containing liquid coating step (S01) is a step of applying a metal-containing liquid on the underlayer film on the surface of the wafer W. The metal-containing liquid is a liquid in which a material (metal hard mask material) of a hard mask containing metal (metal hard mask) is dissolved in a solvent. By applying the metal-containing liquid on the underlayer film of the wafer W, the metal hard mask material is applied to the surface of the wafer W. The metal-containing liquid coating step (S01) may be performed by using the liquid processing unit U1 of the processing module 11.

The deprotection promoting step (S02) is a step of promoting deprotection of the functional groups in the metal hard mask material contained in the metal-containing liquid. Specifically, by irradiating the applied metal-containing liquid with ultraviolet rays, deprotection of the functional groups in the metal hard mask material is promoted. The deprotection promoting step (S02) by irradiating the metal-containing liquid with ultraviolet rays may be performed by using the light emission unit U3 of the processing module 11. An irradiation amount of ultraviolet rays with respect to the metal-containing liquid is not particularly limited, as long as the deprotection of the functional groups in the metal hard mask material is promoted. For example, by irradiating the metal-containing liquid with light of about 180 mJ/cm$^2$ to 800 mJ/cm$^2$, it is possible to promote the deprotection of the functional groups in the metal hard mask material. As a light source that emits ultraviolet rays, for example, an excimer laser using a mixed gas may be used, but the type of the light source may be appropriately changed. A wavelength of ultraviolet rays is not particularly limited, but it is possible to more appropriately promote the deprotection by setting the wavelength of ultraviolet rays to 200 nm or less. As the wavelength of ultraviolet rays, light having a wavelength of, for example, 172 nm or 193 nm may be used, but the wavelength is not limited thereto.

An environment in which the deprotection promoting step (S02) is performed is not particularly limited, but may be configured to have a low-oxygen atmosphere around the wafer W. By performing the deprotection promoting step (S02) in a state in which the low-oxygen atmosphere is set around the wafer W, the deprotection of the functional groups by irradiating ultraviolet rays is effectively promoted. The low-oxygen atmosphere means an atmosphere in which a ratio of oxygen is 300 ppm or less. In addition, the deprotection promoting step (S02) may be performed under, for example, a nitrogen atmosphere as the low-oxygen atmosphere.

The solvent removing step (S03) is a step of removing the solvent contained in the metal-containing liquid by a drying process. Specifically, the removal of the solvent is promoted by performing a predetermined heat treatment on the wafer W coated with the metal-containing liquid. In the solvent removing step (S03), for example, the removal of the solvent from the surface of the wafer W is promoted by performing a heat treatment for about 30 seconds to 90 seconds at a heating temperature of 100 degrees C. to 170 degrees C. For example, in the solvent removing step (S03), the wafer W may be heated under a condition of the heating temperature of 130 degrees C. and the heating time of 60 sec. The heating temperature in the solvent removing step (S03) is set to be higher than a volatile temperature of the solvent contained in the metal-containing liquid. In addition, the heating time is set such that a state in which a temperature of a surface of the metal-containing liquid becomes higher than the volatile temperature of the solvent by the heat treatment is maintained for a predetermined period of time. The solvent removing step (S03) may be performed by using the heat treatment unit U2 of the processing module 11.

As the solvent removing step (S03), instead of performing the predetermined heat treatment, a gas flow by a predetermined atmosphere may be provided around the wafer W so as to promote the removal of the solvent. When the gas flow is provided around the wafer W by the predetermined atmosphere, it is also possible to promote the removal of the solvent as in the case of performing the heat treatment.

The moisture absorbing step (S04) is a step of bringing the metal hard mask material contained in the metal-containing liquid on the surface of the wafer W into contact with moisture so as to promote hydrolysis of the metal hard mask material. A procedure is not particularly limited, as long as the metal hard mask material on the surface of the wafer W is capable of coming into contact with moisture. For example, the moisture absorbing step (S04) may be performed by spraying water vapor on the wafer W, or by directly spraying water on the surface of the water W. In addition, the moisture absorbing step (S04) may be performed after the solvent removing step (S03). By performing the moisture absorbing step (S04) after the solvent is removed from the surface of the wafer W in the solvent removing step (S03), the contact between the metal hard mask material and moisture can be promoted and moisture-absorbing efficiency can be enhanced. The moisture absorbing step (S04) may be performed by using a mechanism that washes away the rinsing liquid in the development unit U4 of the processing module 14.

The heating step (S05) is a step of curing the metal hard mask material contained in the metal-containing liquid so as to form the metal hard mask on the wafer W. By going through this step, the metal hard mask as the intermediate film is formed. As a heating temperature and a heating time in the heating step (S05), a heating temperature and a heating time used when forming the metal hard mask are applied. In the heating step (S05), the metal hard mask is formed on the surface of the wafer W by performing, for example, a heat treatment for about 30 seconds to 90 seconds at a heating temperature of 200 degrees C. to 300 degrees C. The heating step (S05) may be performed by using the heat treatment unit U2 of the processing module 11.

By the procedure described above, the metal hard mask as the interlayer film is formed on the water W. After forming the metal hard mask, the resist film is formed directly above the metal hard mask.

[Actions]

In the substrate processing method and the substrate processing apparatus described in the embodiment described above, the deprotection promoting step, the solvent removing step, and the moisture absorbing step are performed prior to the heating step of curing the metal-containing liquid to form the metal hard mask, By performing each of the above-described steps, it is possible to improve the uniformity in film thickness and film quality of the metal hard mask, and to improve the uniformity in line width of the resist pattern on the substrate.

In a semiconductor-manufacturing process, there is an opportunity to use a metal hard mask due to fineness of a resist pattern. However, there is room for improving the uniformity in line width (critical dimension (CD) or minimum line width) of a resist pattern when a metal hard mask is used. In contrast, in the substrate processing method described in the present embodiment, it is possible to improve the uniformity in film thickness and film quality of a metal hard mask by performing the deprotection promoting step, the solvent removing step, and the moisture absorbing step before the heating step.

The reason is not certainly clear, but it is considered that each of the above-mentioned steps promotes progress of the reaction of the metal hard mask material at the stage of forming the metal hard mask. It is known that, a metal hard mask film is formed by reducing hydrolysis and dehydration condensation of the metal hard mask material. It is supposed that, among the above-mentioned steps, the solvent removing step and the moisture absorbing step promote hydrolysis especially in the vicinity of a film surface by reducing the solvent around the metal hard mask material and increasing the contact of the metal hard mask material with moisture. In addition, it is supposed that the deprotection promoting step promotes dehydration condensation. As described above, it is supposed that, by performing the deprotection promoting step, the solvent removing step, and the moisture absorbing step before the heating step of forming the metal hard mask, the reaction related to the formation of the metal hard mask is promoted.

In addition, it is considered that the dehydration condensation reaction in the entire film forming the metal hard mask is proceeding by the deprotection promoting step performed before the heating step for forming the metal hard mask. By irradiating the metal-containing liquid containing the metal hard mask material with ultraviolet rays as a deprotection promoting step, it is considered that the metal hard mask material in the film changes to a state in which the dehydration condensation therein proceeds uniformly (regardless of location). As a result, it is considered that the uniformity in film quality in the entire metal hard mask is improved after the heat treatment. It is considered that by improving the uniformity in film quality at the time of forming the metal hard mask, unevenness of the film thickness of the metal hard mask is eliminated and the uniformity in film thickness is also improved. As a result, it is considered that the uniformity in line width of the resist pattern in the resist film formed on the metal hard mask is also improved.

In addition, as a configuration for effectively exerting the above-described actions, it may be possible to adopt a configuration in which the moisture absorbing step is performed after the deprotection promoting step and the solvent removing step. With this configuration, there is a possibility that moisture around the metal hard mask material dries over time after forming an environment in which the contact between the metal hard mask material and the moisture is increased through the moisture absorbing step. In contrast, by adopting the configuration in which the heating step is performed immediately after the moisture absorbing step, it is possible to perform the heating step before moisture around the metal hard mask material dries, and to form the metal hard mask in a state in which thermolysis is promoted. In addition, by adopting the configuration in which transition from the moisture absorbing step to the heating step is rapidly performed, the above-mentioned actions can be more effectively achieved.

In addition, the solvent removing step and the moisture absorbing step may be continuously performed in this order. By providing the moisture absorbing step after promoting the removal of the solvent around the metal hard mask material, it is possible to increase the contact between the metal hard mask material and moisture so that the reaction of the metal hard mask material can be promoted.

In addition, when a configuration in which the deprotection promoting step and the solvent removing step are performed in this order is adopted, it is possible to shorten the interval between the solvent removing step and the heating step. Depending on a type of metal hard mask material, temperatures applied in the solvent removing step and the heating step may change significantly. In that case, a temperature Change of the metal hard mask material may affect the film quality. By bringing the two heating-related steps, i.e., the solvent removing step and the heating step, closer to each other, it becomes possible to form the metal hard mask regardless of the type of the metal-containing liquid containing the metal hard mask material.

In addition, the deprotection promoting step may be performed in a low-oxygen atmosphere. By performing the deprotection promoting step in the low-oxygen atmosphere, it is possible to reduce influence of oxygen compared with, for example, a case where the deprotection promoting step is performed in an atmosphere containing a large amount of oxygen. In particular, when the metal hard mask material is irradiated with ultraviolet rays in the deprotection promoting step, it is possible to prevent ozone, which may be generated by reaction of oxygen and ultraviolet rays, from affecting the deprotection of the functional groups.

[Modifications]

It shall be understood that embodiments and modifications disclosed herein are examples in all respects and are not restrictive. The above embodiments may be omitted, replaced, or modified in various forms without departing from the scope and spirit of the appended claims.

A modification of the metal hard mask formation procedure will be described. The metal hard mask formation procedure illustrated in FIG. 5 may be appropriately changed. FIG. 5 illustrates the case where the metal-containing liquid coating step (S01), the deprotection promoting step (S02), the solvent removing step (S03), the moisture absorbing step (S04), and the heating step (S05) are performed in this order. However, in the metal hard mask formation procedure, the order of the deprotection promoting step, the solvent removing step, and the moisture absorbing step can be appropriately changed. If possible, some of these steps may be performed at the same time.

For example, the deprotection promoting step and the solvent removing step may be performed at the same time. In addition, as illustrated in FIG. 6, a configuration in which the metal-containing liquid coating step (S01), the solvent removing step (S03), the deprotection promoting step (S02), the moisture absorbing step (S04), and the heating step (S05) are performed in this order by changing the order of the deprotection promoting step and the solvent removing step may be adopted. When the configuration in which the solvent removing step (S03) and the deprotection promoting step (S02) are performed in this order is adopted, the deprotection promoting step is performed after removing the solvent from the metal-containing liquid to some extent. Accordingly, the deprotection promoting step may be performed in a state in which a ratio of the solvent in the metal-containing liquid coated on the wafer W is reduced. As a result, it is possible to reduce the possibility that the solvent adheres to a unit that performs the deprotection promoting step (the light emission unit U3), and to suppress the frequency of maintenance. In addition to the order described above, for example, the order of the solvent removing step (S05) and the moisture absorbing step (S04) may be changed. In addition, execution conditions (parameters) or the like when performing each step may be appropriately changed.

Next, a modification of the configuration of the apparatus that performs the substrate processing method described in the above embodiment will be described. The substrate processing method described in the above embodiment may be performed by using the above-mentioned coating and developing apparatus 2. In the above embodiment, the procedure for forming the metal hard mask by using the plurality of processing modules has been described. However, by changing the configuration of the processing modules, each step may be performed by using the same processing module.

FIG. 7 illustrates an exemplary processing module capable of performing the deprotection promoting step (S02), the solvent removing step (S05), and the moisture absorbing step (S04) in the substrate processing apparatus according to a modification, Regarding a processing module 20 illustrated in FIG. 7, a case where the deprotection promoting step (S02) is performed by irradiating the wafer W with ultraviolet rays and the solvent removing step (S03) is performed by drying the substrate will be described.

The processing module 20 according to the modification illustrated in FIG. 7 may be divided into two processing chambers 21 and 22. The processing chamber 21 is provided with a heating mechanism 30, which also functions as a heating processor. The heating mechanism 30 includes a support stage 31, a hot plate 32, a chamber (a lid) 33, and support pins 34. In addition, the heating mechanism 30 has a ring shutter 35 so as to be capable of sealing the interior thereof by connecting the support stage 31 and the chamber 33. The hot plate 32 serving as a heat source is accommodated on the support stage 31, and a heat received by the wafer W from the hot plate 32 can be controlled by supporting the wafer W at a distance from the hot plate 32 by using the support pins 34. Therefore, the heating mechanism 30 of the processing chamber 21 is capable of controlling a heating temperature of the wafer W to both the heating temperature in the solvent removing step and the heating temperature in the heating processing step.

In addition, a bubbler 37 configured to generate water vapor is connected to the chamber 33 of the heating mechanism 30 via a pipe 36, Since the water vapor from the bubbler 37 is allowed to be supplied into the chamber 33 of the heating mechanism 30 via the pipe 36, when the wafer W is disposed on the hot plate 32, the surface of the wafer W can be brought into contact with the water vapor, Therefore, it is also possible to perform the moisture absorbing step in the heating mechanism 30. As described above, by using the heating mechanism 30 provided in the processing chamber 21 of the processing module 20, it is possible to perform the heating step as well as the solvent removing step and the moisture absorbing step. In addition, a thermocouple or the like may be provided in the heating mechanism 30 to control the heating mechanism 30 using temperature information or the like detected by the thermocouple.

The processing chamber 22 is partitioned from the processing chamber 21 by an operable shutter 41. Inside the processing chamber 22, a light source 42 configured to emit ultraviolet rays is provided. Further, since a gas pipe 43 for supplying a gas to the processing chamber 22 partitioned by the shutter 41 is connected, it is possible to set the interior of the processing chamber 22 to be a predetermined type of atmosphere. In addition, the wafer W can be cooled and moved by using an arm 44 provided in the processing chamber 22. As described above, it is possible to perform the deprotection promoting step by using the light source 42 provided in the processing chamber 22 of the processing module 20.

When the processing module 20 described above is used, first, a series of processes after the metal-containing liquid coating step can be performed only by moving the wafer W between the processing chambers 21 and 22. For example, when the deprotection promoting step (S02), the solvent removing step (S03), and the moisture absorbing step (S04) are performed in this order, first, the deprotection promoting step (S02) is performed by irradiating the wafer W with ultraviolet rays in the processing chamber 22. Thereafter, by moving the water W to the processing chamber 21, it is possible to continuously perform the solvent removing step (S03) by using the heating by the hot plate 32 and the moisture absorbing step (S04) by using the supply of water vapor from the bubbler 37. In addition, the heating step (S05) may be also performed by changing the heating temperature of the hot plate 32.

As described above, with the processing module 20, it is possible to perform a series of steps related to the formation of the metal hard mask using the same processing module. By processing the substrate using the processing module 20, it is possible to reduce movement of the wafer W between the processing modules, thereby improving the work efficiency. In addition, by using the same heating mechanism 30 as the solvent remover and the heating processor, it is possible to perform a series of steps related to the formation of the metal hard mask while preventing addition of a processing module or a heat treatment unit.

In addition, since the solvent remover, the moisture absorbing-processor, and the heating processor are provided in the same processing chamber inside the processing module 20, it is possible to prevent the solvent atmosphere, moisture, or the like, which is generated during the operations performed by the respective parts, from scattering to other components or the like.

The configuration of the processing module 20 described above is an example, and can be appropriately changed. In addition, the combination of processing modules for performing a series of steps related to the formation of the metal hard mask described in the above embodiments can also be appropriately changed.

In the above embodiments, the case where the metal-containing liquid is used to form the metal hard mask provided directly below the resist film has been described. However, it is sufficient that the film formed using the metal-containing liquid is provided below the resist film, and a separate film, which is different from the two types of films including the film formed using the metal-containing liquid and the resist film, may be provided between the film formed using the metal-containing liquid and the resist film.

EXAMPLES

Hereinafter, examples will be described, but the present disclosure is not limited thereto.

The following experiments were conducted in order to confirm that characteristics were improved when a resist pattern was formed using the substrate processing system 1 according to the above embodiment.

Comparative Example 1

A substrate according to Comparative Example 1 was formed by the following procedure using the substrate processing system 1 according to the embodiment described above. First, a metal-containing liquid containing a metal hard mask material was coated on a wafer W, and then a metal hard mask was formed by performing a heat treatment at a heating temperature of 250 degrees C. for 60 seconds (heating step), whereby the substrate (before forming a resist film) according to Comparative Example 1 was obtained. Thereafter, a resist film was formed on the surface and an exposure and development process was performed, whereby a substrate according to Comparative Example 1 having a predetermined resist pattern was fabricated.

Comparative Example 2

Similar to Comparative Example 1, first, a metal-containing liquid containing a metal hard mask material was coated on a wafer W, and then a solvent was removed by performing a heat treatment at a heating temperature of 130 degrees C. for 60 seconds (solvent removing step). Subsequently, the surface was brought into contact with water by causing the water to flow on the surface for 15 seconds (moisture absorbing step). Then, a meatal hard mask was formed by performing a heat treatment at a heating temperature of 250 degrees C. for 60 seconds (heating step), whereby a substrate (before forming a resist film) according to Comparative Example 2 was obtained. Thereafter, a resist film was formed on the surface and an exposure and development process was performed, whereby a substrate according to Comparative Example 2 having a predetermined resist pattern was fabricated.

Comparative Example 3

Similar to Comparative Example 1, first, a metal-containing liquid containing a metal hard mask material was coated on a wafer W, and then the surface was irradiated with ultraviolet rays by using an excimer laser light source having a wavelength of 172 nm and an output of 800 mJ under a nitrogen atmosphere (deprotection promoting step). Then, a metal hard mask was formed by performing a heat treatment at a heating temperature of 250 degrees C. for 60 seconds (heating step), whereby a substrate (before forming a resist film) according to Comparative Example 3 was obtained. Thereafter, a resist film was formed on the surface and an exposure and development process was performed, whereby a substrate according to Comparative Example 3 having a predetermined resist pattern was fabricated.

Example 1

Similar to Comparative Example 1, first, a metal-containing liquid containing a metal hard mask material was coated on a wafer W, and then a solvent was removed by performing a heat treatment at a heating temperature of 130 degrees C. for 60 seconds (solvent removing step). Subsequently, the surface was brought into contact with water by causing the water to flow on the surface for 15 seconds (moisture absorbing step). Subsequently, the surface of the substrate was irradiated with ultraviolet rays by using an excimer laser light source having a wavelength of 172 nm and an output of 800 mJ under a nitrogen atmosphere (deprotection promoting step), Then, a metal hard mask was formed by performing a heat treatment at a heating temperature of 250 degrees C. for 60 seconds (heating step), whereby a substrate (before forming a resist film) according to Example 1 was obtained. Thereafter, a resist film was formed on the surface and an exposure and development process was performed, whereby a substrate according to Example 1 having a predetermined resist pattern was fabricated.

(Evaluation Result-1)

Figure 8A:
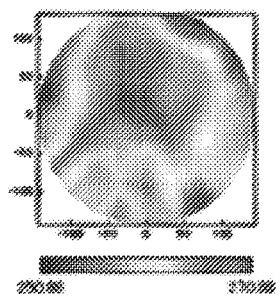
FIGS. 8A, 8B, 8C, and 8D are views illustrating evaluation results of line width of resist patterns on substrates according to Comparative Examples and Example.
Figure 8B:
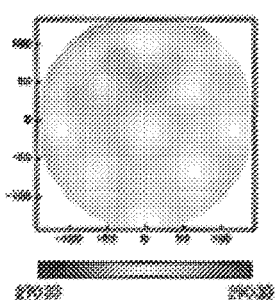
Figure 8C:
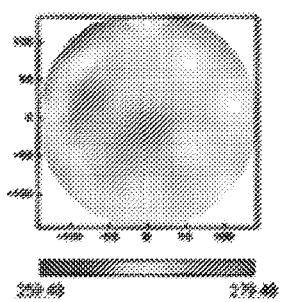
Figure 8D:
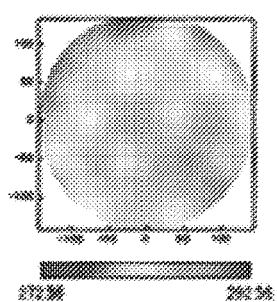

Uniformity in film thickness of the metal hard mask on the substrate (before forming the resist film) according to each of Comparative Examples 1 to 3 and Example 1 was evaluated. The film thickness of the metal hard mask on each substrate was measured by a spectroscopic ellipsometry. The measurement results and variation thereof (FTU: 3σ) are shown in FIGS. 8A to 8D. FIG. 8A shows the result of Comparative Example 1, FIG. 8B shows the result of Comparative Example 2. FIG. 8C shows the result of Comparative Example 3, and FIG. 8D shows the result of Example 1.

(Evaluation Result-2)

Figure 9A:
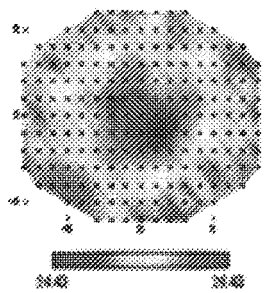
FIGS. 9A, 9B, 9C, and 9D are views illustrating evaluation results of film thicknesses of metal hard masks on substrates according to Comparative Examples and Examples.
Figure 9B:
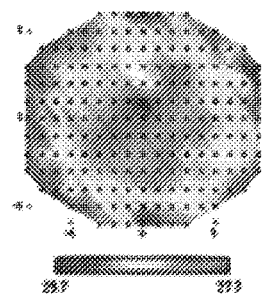
Figure 9C:
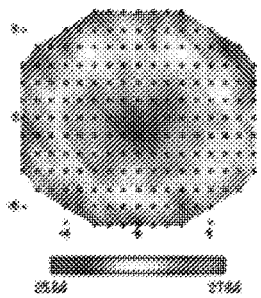
Figure 9D:
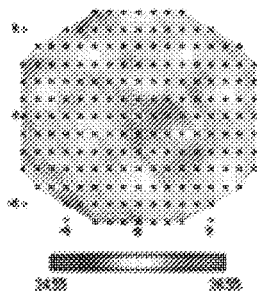

Uniformity in hole diameters (corresponding to CD) of the resist pattern on the substrate according to each of Comparative Examples 1 to 3 and Example 1 was evaluated. The resist pattern on each substrate was measured by a critical dimension-scanning electron microscope (CD-SEM). The measurement results and variation thereof (CDU: 3σ) are shown in FIGS. 9A to 9D. FIG. 9A shows the result of Comparative Example 1, FIG. 9B shows the result of Comparative Example 2, FIG. 9C shows the result of Comparative Example 3, and FIG. 9D shows the result of Example 1.

(Evaluation Result-3)

A refractive index of the metal hard mask on the substrate (before forming the resist film) according to each of Comparative Example 1 and Example 1 with respect to light having a wavelength of 193 nm was measured. Table 1 shows averages and variation (3σ) of the measurement results.

(Evaluation Result-4)

A contact angle on the surface of the substrate (before forming the resist film) according to each of Comparative Example 1 and Example 1 was measured. The measurement results are shown in Table 1. In view of the fact that the contact angle in Example 1 is larger than that in Comparative Example 1, it is presumed that OH groups on the surface of the metal hard mask are reduced.

From the results of Evaluation Result-3 and Evaluation Result-4, compared to Comparative Example 1, Example 1 shows a smaller refractive index and variation thereof and a larger contact angle. From this, it is presumed that in Example 1, the reaction was promoted compared to Comparative Example 1.

[Table 1]

TABLE 1

|  | Comparative Example 1 | Example 1 |
|---|---|---|
| Refractive Index (193 nm) Average | 1.564 | 1.466 |
| Refractive Index (193 nm) 3σ | 0.030 | 0.022 |
| Contact Angle (deg) | 17.4 | 23.9 |

EXPLANATION OF REFERENCE NUMERALS

1: substrate processing system, 2: coating and developing apparatus (substrate processing apparatus), 11 to 14, 20: processing module, 30: heating mechanism, 100: control device, W: wafer (substrate)

What is claimed is:
1. A substrate processing method comprising:
   a metal-containing liquid coating process of applying a metal-containing liquid in which a metal hard mask material is dissolved on a surface of a substrate;
   a deprotection promoting process of promoting deprotection of functional groups included in the metal hard mask material contained in the metal-containing liquid;
   a solvent removing process of removing a solvent included in the metal-containing liquid on the substrate;

a moisture absorbing process of bringing the metal hard mask material contained in the metal-containing liquid into contact with moisture; and a heating process of curing the metal hard mask material contained in the metal-containing liquid so as to form a metal hard mask on the substrate, wherein the heating process is performed after the deprotection promoting process, the solvent removing process and the moisture absorbing process.

2. The substrate processing method of claim 1, wherein the deprotection promoting process includes irradiating the substrate with ultraviolet rays, and wherein the solvent removing process includes drying the substrate.

3. The substrate processing method of claim 1, wherein the moisture absorbing process is performed after the solvent removing process.

4. The substrate processing method of claim 1, wherein the moisture absorbing process is performed after the deprotection promoting process and the solvent removing process.

5. The substrate processing method of claim 1, wherein the solvent removing process is performed after the deprotection promoting process.

6. The substrate processing method of claim 1, wherein the deprotection promoting process is performed after the solvent removing process.

7. The substrate processing method of claim 1, wherein the deprotection promoting process is performed in an atmosphere in which a ratio of oxygen is 300 ppm or less.

8. The substrate processing method of claim 1, further comprising forming a resist film on the metal hard mask.

* * * * *